United States Patent [19]

Yamada et al.

[11] Patent Number: 4,594,550
[45] Date of Patent: Jun. 10, 1986

[54] METHOD OF SCANNING SPECIFYING MAGNETIC FIELD FOR NUCLEAR MAGNETIC RESONANCE IMAGING

[75] Inventors: Yoshifumi Yamada, Utsunomiya; Kunio Tanaka, Asahikawa; Zenwemon Abe, Yokohama, all of Japan

[73] Assignee: Utsunomiya University, Utsunomiya, Japan

[21] Appl. No.: 528,648

[22] Filed: Sep. 1, 1983

[30] Foreign Application Priority Data

Sep. 7, 1982 [JP] Japan ............................ 57-154491
Sep. 16, 1982 [JP] Japan ............................ 57-159438

[51] Int. Cl.[4] ........................................ G01R 33/22
[52] U.S. Cl. ............................ 324/307; 324/318
[58] Field of Search .............. 324/309, 312, 319, 307

[56] References Cited

U.S. PATENT DOCUMENTS

| | | | |
|---|---|---|---|
| 3,932,805 | 1/1976 | Abe | 324/309 |
| 4,021,726 | 5/1977 | Garroway | 324/312 |
| 4,115,730 | 9/1978 | Mansfield | 324/309 |
| 4,333,053 | 6/1982 | Harrison | 324/309 |

FOREIGN PATENT DOCUMENTS 133192 of 1979 Japan ................................ 324/309

*Primary Examiner*—Reinhard J. Eisenzopf
*Assistant Examiner*—G. Peterkin
*Attorney, Agent, or Firm*—Stevens, Davis, Miller & Mosher

[57] ABSTRACT

The disclosed method of scanning a specifying magnetic field for nuclear magnetic resonance (NMR) imaging comprises steps of generating the specifying magnetic field by synthesis of a static magnetic field and a magnetic field produced by a group of magnetomotive forces, and moving the center of the specifying magnetic field by superposing a scanning magnetic field from a scanner coil in a certain direction of the magnetic field of the group of magnetomotive forces.

27 Claims, 12 Drawing Figures

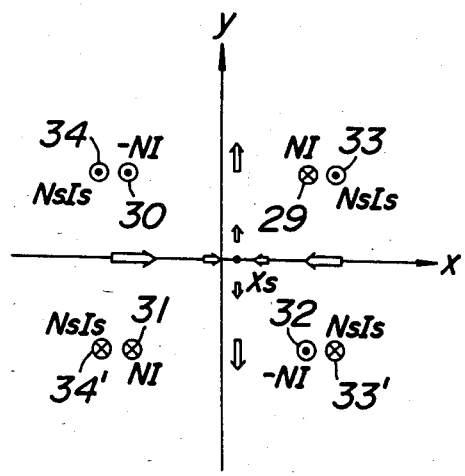
FIG_4
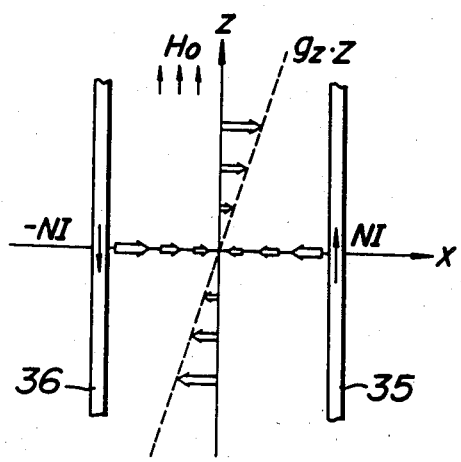
FIG_5
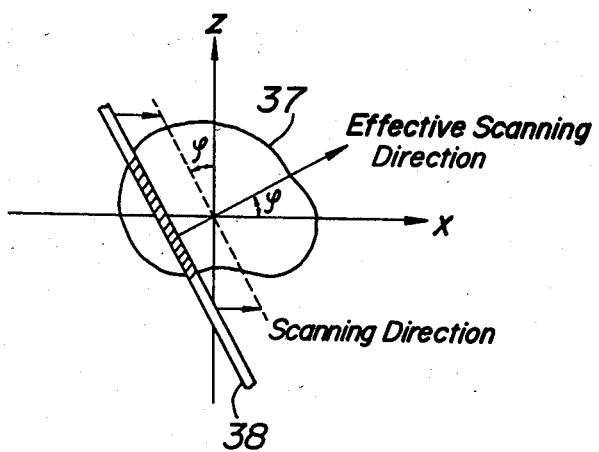
FIG_6

FIG_8
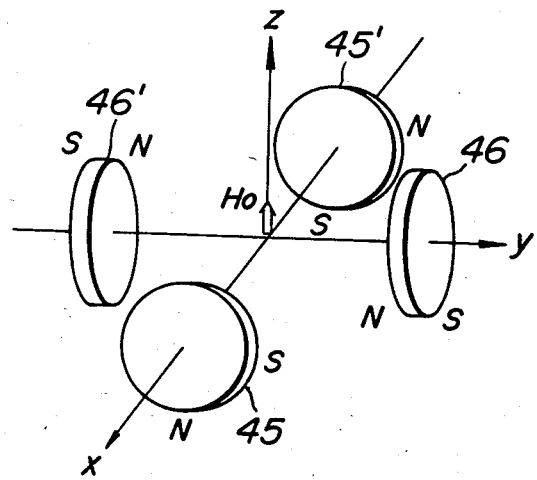
FIG_9
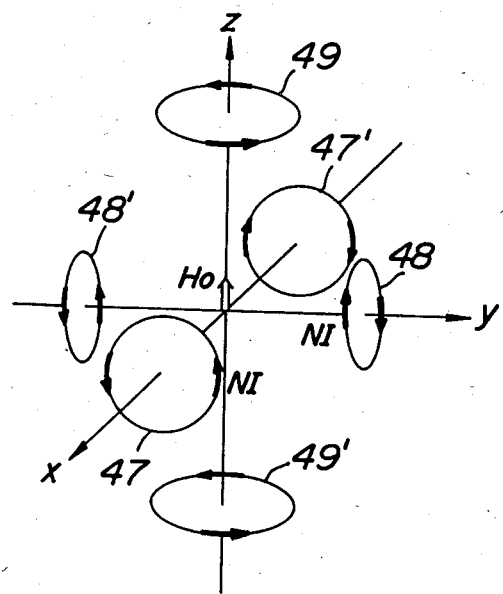

METHOD OF SCANNING SPECIFYING MAGNETIC FIELD FOR NUCLEAR MAGNETIC RESONANCE IMAGING

BACKGROUND OF THE INVENTION

1. Field of the Invention

This invention relates to a method of scanning a specifying magnetic field for imaging and measuring internal information of a body being measured (to be referred to as a target hereinafter) by using nuclear magnetic resonance (to be referred to as NMR). More particularly, the invention relates to a method of scanning a specifying magnetic field, which is generated by applying a local static magnetic field different from the surrounding field to an area being measured, so as to facilitate extraction of information only from the area being measured by using the difference in the resonance frequency, for instance the NMR information relating to nuclear magnetic substances in the target, such as hydrogen (H), fluorine (F), sodium (Na), potassium (K), magnesium (Mg), carbon (C), and phosphorus (P) in the inside of the target, and the invention aims at provision of a scanning method which facilitates production of a practical electric scanner of light weight and simple structure for scanning the specifying magnetic field produced with a comparatively low electric power.

2. Description of the Prior Art

In typical conventional methods of scanning the specifying magnetic field for NMR imaging, such as the method disclosed by the inventors in their Japanese Patent Laid-Open Publication No. 133,192/1979 relating to a method of producing specifying magnetic field, a line-shaped focusing magnetic field is generated by using a group of parallel wires so as to produce line-shaped specifying magnetic field in a line-shaped area within a target for NMR measurement, and the thus produced specifying field is scanned by regulating or switching the distribution of electric currents in the group of parallel wires. The conventional methods of scanning the specifying magnetic field have a shortcoming in that the coils for carrying electric currents are complicated, that a switching circuit is necessary for regulating the distribution of electric currents, and that the driving of such switching circuit is complicated.

As to the configuration of the specifying magnetic field $\Delta H_s$ to be scanned by the conventional methods, there are number of variations; such as the line-shaped focusing magnetic field having magnetic field equipotential surfaces of cylindrical shape extending in the direction of the static magnetic field $H_o$ in the measuring area, the spherical or ellipsoidal focusing magnetic field having closed equipotential surfaces of spherical or ellipsoidal shape, and the focusing magnetic field having equipotential surfaces which open to the surrounding in a trumpet- or drum-like shape. With the conventional methods, it has been noted that complicated processes are necessary to scan the specifying magnetic fields of such wide variety.

Further, in the conventional methods of producing the specifying magnetic fields such as the inventors' method disclosed in the above-mentioned Japanese Patent Laid-Open Publication, the line-shaped specifying magnetic field or a line-shaped focusing magnetic field is produced in the target by using a group of parallel wires so as to extract the NMR information from a cylindrical portion of the target, and such line-shaped specifying magnetic field is formed by synthesis of a long homogeneous static magnetic field extending in a longitudinal direction and a magnetic field with no components in the longitudinal direction produced by the group of parallel wires. Accordingly, the group of parallel wires are very long as compared with the spacing therebetween, and the coils for producing the line-shaped focusing magnetic field are much bigger than coils for detecting the NMR signals. Consequently, the conventional methods have shortcomings in that a driving system with high power is necessary to produce the required specifying magnetic field and that a large amount of coil material is necessary so that the NMR device becomes heavy.

Regarding the details of the conventional methods of producing the above-mentioned specifying magnetic field, the line-shaped specifying magnetic field has closed equipotential contours on a plane perpendicular to the static magnetic field, the closed equipotential contours having no electric current therein and being parallel to each other in the direction of the static magnetic field in a certain area, and such line-shaped specifying magnetic field is produced by disposing a group of wires substantially in parallel to the direction of the static magnetic field and applying such electric currents to the group of wires that the magnetic fields induced by the group of wires cancel each other at a certain spatial point. Theoretically, it is possible to produce such line-shaped specifying magnetic field by synthesizing a homogeneous static magnetic field and a magnetic field having components only in directions perpendicular to the direction of the homogeneous static magnetic field, said magnetic field components being zero on a certain spatial line while being non-zero in other areas.

p In view of such theoretical possibility, if a group of differential coils are formed by a plurality of closed loop coils and electric currents of such magnitudes and such directions are applied to the differential coils that magnetic fields induced by the closed loop coils are cancelled by each other at a certain spatial point, and if a synthesis is tried by superposing that static magnetic field which is homogeneous in all directions except at the aforesaid certain point onto the magnetic field induced by the closed loop coils, such synthesis has a shortcoming in that the variation of the intensity of the synthesized magnetic field is predominantly influenced by the superposed static magnetic field and the synthesized magnetic field is nothing but a gradient magnetic field having a gradient of magnetic field intensity in the direction of the superposed static magnetic field.

However, in the above-mentioned synthesis of the magnetic field induced by the group of differential coils and the static magnetic field, if there should be a certain means for cancelling that component of the synthesized magnetic field which is in the direction of the superposed static magnetic field in a selected area, the magnetic field component in the direction perpendicular to the direction of the superposed static magnetic field becomes predominant in the synthesized magnetic field, whereby the line-shaped specifying magnetic field or the line-shaped focusing magnetic field can be obtained.

SUMMARY OF THE INVENTION

Therefore, an object of the present invention is to obviate the above-mentioned shortcoming of the prior art by providing an improved method of scanning a specifying magnetic field for obtaining the internal NMR signals from a target.

Another object of the invention is to provide a practical method of scanning a line-shaped specifying or focusing magnetic field in a quick and simple fashion for facilitating extraction of NMR information from a line-shaped inside portion of a target at a time so as to allow high speed imaging of the NMR information.

Another object of the invention is to provide a method of scanning a specifying magnetic field for NMR imaging, which is free from the shortcomings of the prior art and suitable for production of a line-shaped specifying magnetic field by an apparatus of small size and light weight with a low level of power consumption.

A further object of the invention is to provide a method of scanning a specifying magnetic field which is particularly suitable to an imaging device of spinning density distribution by using the NMR signals and to an imaging device of relaxation time distribution by using NMR signals.

To fulfil the above-mentioned objects, a preferred method of scanning a specifying magnetic field according to the present invention is for nuclear magnetic resonance (NMR) imaging of internal information of a target placed in a homogeneous static magnetic field $H_o$, and the method comprises steps of generating a specifying magnetic field $\Delta H_s$ by synthesizing said static magnetic field $H_o$ with a magnetic field produced by a group of coils or magnets; and moving spatially a center of said spcifying magnetic field $\Delta H_s$ by superposing a scanning magnetic field produced by a scanning coil onto that specific direction component of said magnetic field produced by said group of coils or magnets which specific direction component dominates intensity variation of said specifying magnetic field $\Delta H_s$.

The method of scanning a specifying magnetic field according to the present invention can be applied for scanning a line-shaped focusing magnetic field produced by compensating that direction component of a magnetic field produced by a group of differential coils which direction coincides with the direction of a static magnetic field to be superposed onto the magnetic field of the differential coils, the above-mentioned compensation of the magnetic field being effected by disposing a group of other differential coils at right angles to the first-mentioned differential coils. For instance, a first coil group and a second coil group are provided for producing the above line-shaped focusing magnetic field, each of said coil groups having a plurality of coils disposed in such a manner that when electric currents of specific magnitudes and directions are applied thereto constant components of magnetic fields produced by the individual coils are cancelled by each other so as to substantially eliminate constant components in magnetic fields produced by said coil groups, said first coil group and said second coil group are combined in such a manner that certain direction components of magnetic fields produced by said two coil groups are cancelled by each other in a certain area, whereby said specifying magnetic field $\Delta H_s$ is synthesized in a line-shaped form.

BRIEF DESCRIPTION OF THE DRAWINGS

For a better understanding of the invention, reference is made to the accompanying drawings, in which:

FIG. 4 is a schematic diagram of the manner in which a line-shaped specifying magnetic field is scanned by a method according to the present invention;

FIG. 5 is a schematic diagram similar to FIG. 4, showing the manner in which a line-shaped specifying magnetic field is scannd by another method according to the present invention;

FIG. 6 is a schematic diagram showing the manner in which a line-shaped specifying magnetic field is scanned by a different method according to the present invention;

FIG. 8 is a schematic perspective view illustrating the formation and arrangement of disk magnets for producing a specifying magnetic field to be used in the method according to the present invention; and FIG. 9 is another schematic perspective view showing a different arrangement of current-carrying coils for producing a specifying magnetic field to be used in the method accordng to the present invention.

Throughout different views of the drawings, A is a target; B is an electromagnet for producing a homogeneous static magnetic field; C1, C2 are scanner coils for scanning a specifying magnetic field; D is a transmitter coil; E is a receiver coil; 1 is an RF (radio frequency) oscillator, 2 is a program pulse generator, 3 is a waveshaping gate, 4 is an RF power amplifier, 5 is a preamplifier, 6 is a main amplifier, 7 is a phase-sensitive detector, 8 is an A/D (analog-to-digital) converter, 9 and 10 are D/A (digital-to-analog) converters, 11 and 12 are DC power amplifiers, 13 is a highly stabilized DC power source, 14 is a control computer, 15 is a peripheral display circuit, 21–24, 29–32, 35 and 36 are parallel wires for producing a line-shaped specifying magnetic field, 25–28 are circular coils for producing a line-shaped specifying magnetic field, 33, 33', 34, 34' are scanner parallel wires or scanner Helmholtz coils, 37 is a specimen, 38 is a line-shaped specifying magnetic field, 41, 41', 42, 42', 43, 43', 44, 44', 47, 47', 48, 48' are differential coil pairs, 45, 45', 46, 46' are differential magnet pairs, 49, 49' are an additive coil pair; $H_o$ is a static magnetic field; $H_s$ is a scanning magnetic field; $\Delta H_s$ is a specifying magnetic field; and NI represents ampere-turn.

DESCRIPTION OF THE PREFERRED EMBODIMENTS

Figure 1:
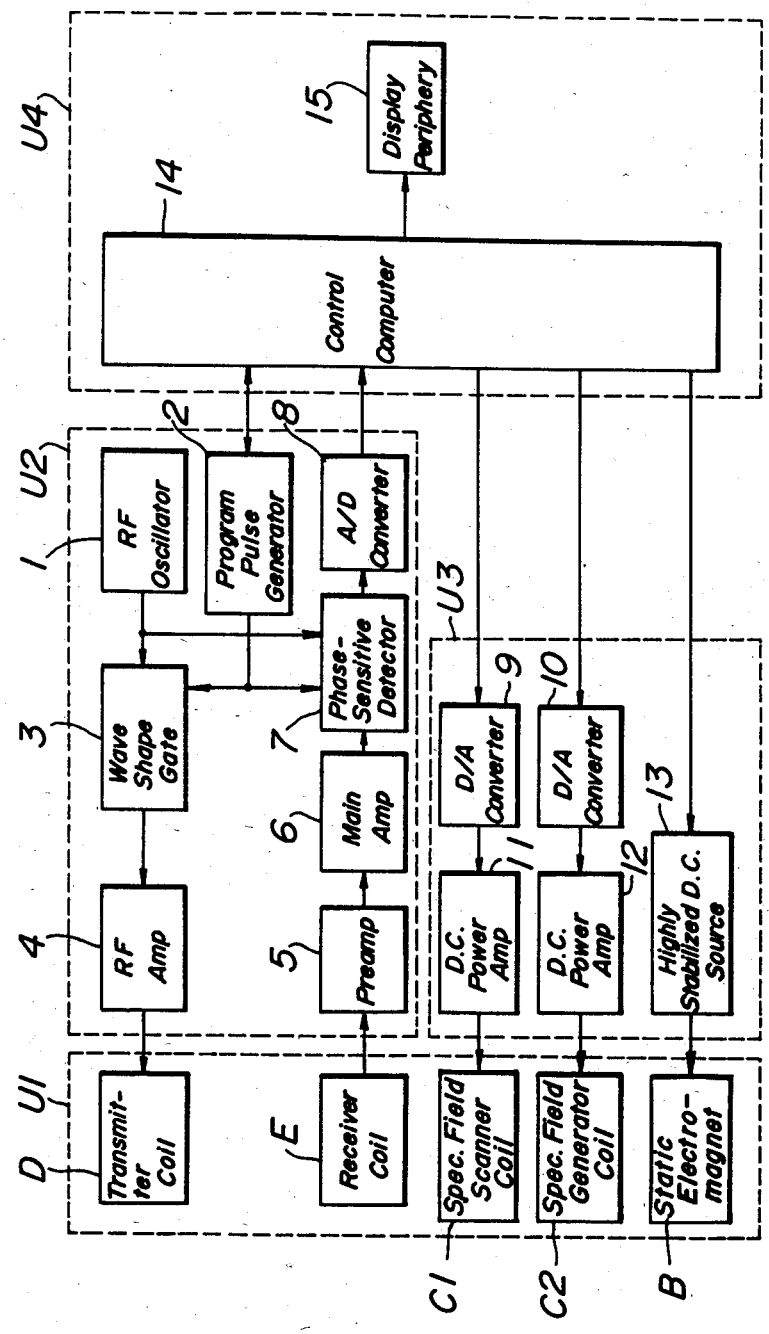
FIG. 1 is block diagram which schematically shows fundamental formation of a device for imaging NMR signals carrying internal information of a target by using a method according to the present invention.
Figure 2:
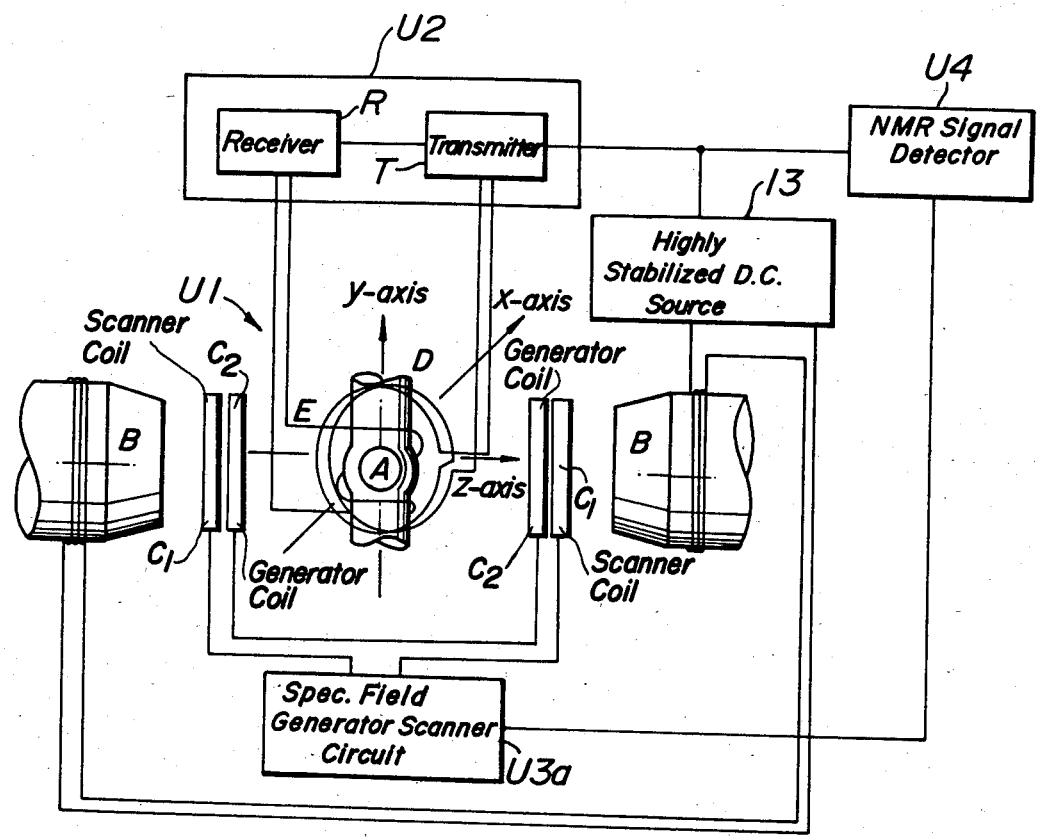
FIG. 2 is a schematic diagram showing formation and arrangement of various elements for generating a variety of magnetic fields for producing the NMR signals.

Referring to FIG. 1 showing the fundamental formation of the device for imaging and measuring NMR signals carrying internal information of a target by using a method according to the present invention, the illustrated device for carrying out the method of the invention comprises four units. The first unit U1 is an NMR apparatus having a transmitter coil D, a receiver coil E, a set of electromagnets B for producing a homogeneous static magnetic field, a specifying magnetic field generator coil C2, and a scanner coil C1, which coils and electromagnets are arranged and connected as shown in FIG. 2. The second unit U2 and the third unit U3 are means for driving various elements in the first unit U1, while the fourth unit U4 is a control means of the entire device.

In the arrangement of FIG. 2, a pair of electromagnets B facing each other across a spacing therebetween are energized from a highly stabilized DC power source 13, as so as to produce a homogeneous static magnetic field $H_o$. The specifying magnetic field generator coil C2 and the scanner coil C1 are disposed in the proximity of the electromagnets B and energized by a specifying magnetic field scanning circuit U3a, so as to superpose a specifying magnetic field $\Delta H_s$ of suitable configuration onto the static magnetic field $H_o$.

In this connection, although it is described that the homogeneous static magnetic field $H_o$ is produced by the pair of electromagnets B in the fundamental formation as shown in FIG. 2, it is natural that this magnetic field $H_o$ can be produced also by air-core coils, superconductive magnets or permanent magnets which are provided for forming a homogeneous static magnetic field. Besides, it is natural also that the coils C1, C2 for generating and scanning the specifying magnetic field $\Delta H_s$ can be disposed not only in parallel with the Z-axis as shown in FIG. 2, but also in parallel with the Y-axis or the X-axis in response to the fashion of generation and scanning thereof.

A target A is placed in the composite magnetic field $(\Delta H_s + H_o)$ thus formed by the superposition, and a transmitter coil D is disposed around the target A and energized by the transmitter T of the second unit U2, so as to superpose a high-frequency magnetic field onto the composite magnetic field at the target A. When the frequency of the high-frequency magnetic field of NMR thus superposed coincides with the nuclear magnetic resonance frequency of a specific nucleus being measured within the target A, NMR signals are generated, and the receiver coil E responds to such NMR signals and produces an induced current to be supplied to the receiver R of the second unit U2 for detection thereof.

The axes of the transmitter coil D and the receiver coil E are disposed perpendicular to the direction of the homogeneous static magnetic field $H_o$ produced by the static magnetic field generator electromagnets B. The nuclear magnetic substance in the target A has a Larmor frequency which is determined by the intensity of the static magnetic field at the target A with a one-to-one relationship. When the high-frequency magnetic field with the Larmor frequency is applied to the transmitter coil D, the NMR phenomenon takes place, and an electromotive force of that frequency is induced in the receiver coil E. Since the Larmor frequency is determined by the magnetic field intensity in one-to-one relationship, if the specifying magnetic field generator coil C2 and the scanner coil C1 apply such specifying magnetic field $\Delta H_s$ of non-linear type to the target A which has a very small variation of the magnetic field intensity within a limited area of the target A (to be referred to as measuring target MT area, hereinafter), while the variation of the magnetic field outside the MT area is rapid, the NMR signals can be obtained exclusively from the MT area. As a result, the NMR frequency varies considerably between the MT area and the outside thereof, and the information concerning the MT area can be discriminated from the information of the outside thereof so as to facilitate the selective measurement of the MT area.

A number of different configurations of the above-mentioned specifying magnetic field for selective extraction of the NMR signals from the MT area are possible; namely, a line-shaped specifying magnetic field in which the area having a homogeneous magnetic field intensity is of line-shape, a star-shaped specifying magnetic field of which homogeneous magnetic field intensity area is in the form of branches extending outwards to the surrounding areas, and a spherical or ellipsoidal specifying magnetic field having a constant magnetic field intensity area of spherical or ellipsoidal shape. Preferably, the specifying magnetic field to be used for the method according to the present invention is of line shape, and the method of the present invention will be described by referring to the line-shaped specifying magnetic field which is simple in shape and suitable for practical applications.

Figure 3A:
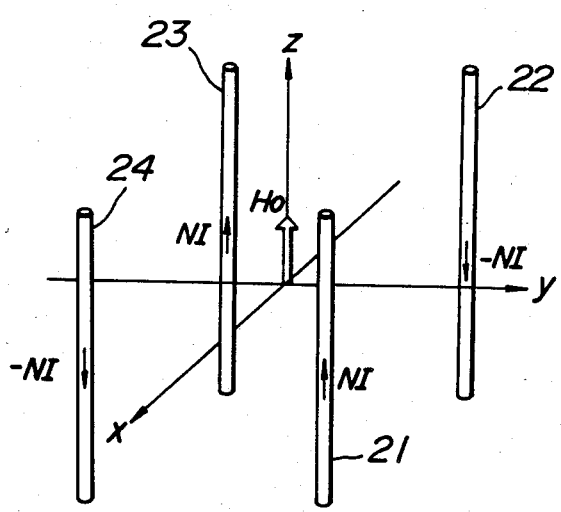
FIG. 3A and FIG. 3B are schematic perspective views of a group of parallel wires and two pairs of differential coils disposed at right angles.
Figure 3B:
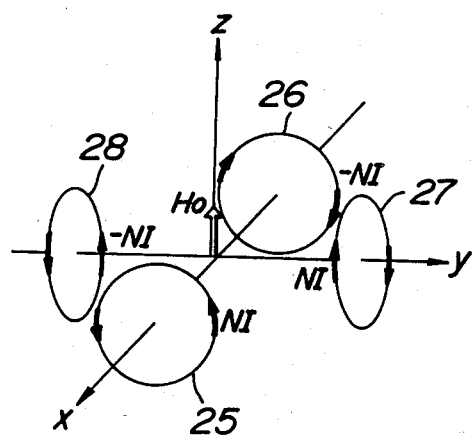

The specifying magnetic field generator coil C2 of the unit U1 of FIG. 1 is, for instance, made of parallel wires as shown in FIG. 3A or circular differential coils as shown in FIG. 3B, and produces a line-shaped specifying magnetic field extending in the diection of the homogeneous static magnetic field $H_o$. The specifying magnetic field scanner coil C1 electrically scans this line-shaped specifying magnetic field substantially without causing any deformation of the magnetic field, so that one can obtain an image of internal NMR signals from a target A such as an image of spin density distribution or nuclear magnetic relaxation time.

As pointed out above, the first unit U1 containing the homogeneous static magnetic field generator magnets B, the transmitter coil D and the receiver coil E is an essential NMR apparatus having elements which are selectively driven by the combined action of the second unit U2 and the third unit U3 under the control of the fourth unit U4. The fourth unit U4 not only effects the overall control of the device of FIG. 1, but also processes the measured values and provides display thereof.

The formation and function of such units will be summarized now. An RF oscillator 1 provides a high-frequency signal whose frequency is the same as the Larmor frequency corresponding to the magnetic field intensity at the central portion of the specifying magnetic field $\Delta H_s$ to be applied to the target A. Output pulses from a program pulse generator 2 under the control of a control computer 14 of the fourth unit U4 act to gate a wave-shaping gate 3 so as to render a desired frequency spectrum to the high-frequency signal from the RF oscillator 1 for producing desired high-frequency pulses. The thus shaped high-frequency pulses are applied to the transmitter coil D through an RF power amplifier 4. As a result, a high-frequency magnetic field is applied to the target A by the transmitter coil D, and the nuclear magnetization in a certain area in the proximity of the center of the specifying magnetic field applied to the target A is selectively excited by the thus applied high-frequency magnetic field having the specific frequency spectrum. The thus excited nuclear magnetization produces a magnetization component in a direction perpendicular to the static magnetic field $H_o$, and this magnetization component is maximized when the high-frequency pulse for the excitation fulfils the conditions of the so-called 90° pulse.

When the application of the high-frequency pulse from the transmitter coil D ceases, the magnetization component in the direction perpendicular to the static magnetic field $H_o$ causes free precession at different positions in the specifying magnetic field $\Delta H_s$ at Larmor frequencies corresponding to the magnetic field intensities at the individual position, and accordingly a small high-frequency current is induced in the receiver coil E. The thus induced high-frequency current is amplified by a preamplifier 5 and a main amplifier 6, and then detected by a phase-sensitive detector 7 while referring to the output signal from the RF oscillator 1, so that an FID (free induction decay) signal is produced. The FID signal is converted into a digital signal by an A/D converter 8, and the control computer 14 effects frequency analysis on the digital signal thus produced, whereby frequency components corresponding to the magnetic field intensity at the central portion of the specifying magnetic field $\Delta H_s$ are extracted and shown on a display peripheral 15.

The control computer 14 also acts to provide signals for generating and scanning the specifying magnetic field, which signals are converted into analog signals by D/A converters 9 and 10, and the analog signals are amplified by the amplifiers 11 and 12, and then applied to the generator coil C2 and the scanner coil C1 for the specifying magnetic field. Whereby, the specifying magnetic field $\Delta H_s$ is generated and scanned. If the Larmor frequency component corresponding to the magnetic field intensity at the central portion of the specifying magnetic field $\Delta H_s$ is extracted by the scanning, the imaging treatment thereof directly provides an image of spin density distribution.

The highly stabilized DC power source 13 drives the electromagnets B under the control of the control computer 14, so as to produce a homogeneous static magnetic field $H_o$.

The line-shaped specifying magnetic field to be used for the NMR imaging is required to produce a line-shaped focusing magnetic field upon superposition thereof onto a homogeneous static magnetic field $H_o$, and the direction of the line-shaped focusing magnetic field is to be the same as that of superposition. To meet this requirement, a preferred embodiment of the specifying magnetic field generator coil is made of a group of parallel wires 21 through 24 as shown in FIG. 3A, which wires 21–24 are disposed in parallel to the homogeneous static magnetic field $H_o$ and adapted to produce a magnetic field in a differential fashion. Another embodiment of the specifying magnetic field generator coil is made of two sets of differential coil pairs 25, 26 and 27, 28 as shown in FIG. 3B, which two pairs of the differential coils are coupled at right angles to each other so as to cause cancellation of the magnetic field components in the direction of the homogeneous static magnetic field $H_o$. The features of the line-shaped focusing magnetic field of such configuration is in two points: namely, a point that, at the center of the thus formed line-shaped focusing magnetic field, the intensity of the magnetic field produced by the group of the differential parallel wires or by the two orthogonal pairs of differential coils is zero and the intensity of the magnetic field increases linearly with the distance from the center; and another point that the direction of the magnetic field produced by the group of wires or the differential coil pairs is substantially perpendicular to the direction of the homogeneous static magnetic field $H_o$. Accordingly, the variation of the magnetic field intensity in the radial direction of the line-shaped specifying magnetic field formed by the vector synthesis of the two magnetic fields is characteristically quadratic.

The method of scanning such line-shaped specifying magnetic field will be described now. If a homogeneous scanning magnetic field in a direction perpendicular to the homogeneous static magnetic field $H_o$ is superposed on the above-mentioned line-shaped specifying magnetic field, a point on a plane perpendicular to the homogeneous static magnetic field $H_o$ which point has a zero magnetic field intensity in the direction parallel to the plane can be shifted depending on the magnitude of the magnetic field being superposed and the direction thereof on said plane, and the magnetic field intensity contours on said plane are closed around the thus shifted zero magnetic field intensity point. Thus, the line-shaped specifying magnetic field can be scanned at will on the above-mentioned plane perpendicular to the homogeneous static magnetic field $H_o$.

The details of such scanning of the line-shaped specifying magnetic field will be explained now. For simplicity, the description will refer to the specifying magnetic field generated by the group of parallel wires.

Figure 3C:
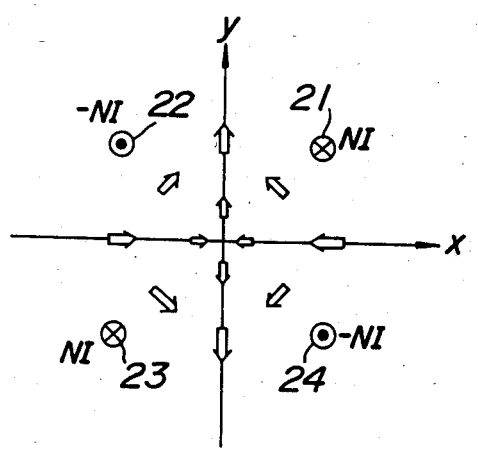
FIG. 3C is a schematic diagram showing the manner in which a line-shaped specifying magnetic field is produced by such coils with illustration of components of such magnetic field.

A first embodiment will be described at first. In this embodiment, a line-shaped specifying magnetic field produced by the four parallel wires 21–24 of FIG. 3A is linearly scanned by superposing a scanning magnetic field produced by a homogeneous magnetic field generator coil. FIG. 3C shows the manner in which a line-shaped specifying magnetic field is produced by the parallel differential four wires 21–24. In FIG. 3C, the homogeneous static magnetic field $H_o$ from the outside is applied in the z-axis direction and the ampere-turns of each of the four parallel wires are assumed to be equal to each other. The magnetic field intensity contours in this case will be closed circles with a center at the origin of the coordinates, so that line-shaped specifying magnetic field extending in the z-axis direction, or the so-called line-shaped focusing magnetic field is formed. The arrows of FIG. 3C show the magnetic field induced by the four parallel wires 21–24. The magnetic field represented by the arrows have components only on the x-y plane, i.e., only the x-axis component of the magnetic field and the y-axis component of the magnetic field, but no component in the z-axis direction. The line-shaped specifying magnetic field of FIG. 3C and the components thereof in different axial directions are given by the following four equations.

$$H_x \simeq -gx \tag{1}$$

$$H_y \simeq gy \tag{2}$$

$$H_z \simeq H_o \tag{3}$$

$$\Delta H_s = \sqrt{H_x^2 + H_y^2 + H_z^2} \simeq H_o\{1 + g^2/2H_o^2(x^2 + y^2)\} \tag{4}$$

Here, g is a constant depending on the spacing between the adjacent parallel wires and the ampere-turns of the individual wires, and the like.

Referring to FIG. 4, if scanner parallel wires or Helmholtz coils 33, 33', 34, 34' adapted to produce substantially homogeneous magnetic fields are provided in addition to the four differential parallel wires 29–32 capable of producing the above-mentioned line-shaped specifying magnetic field, and if the ampere-turns $N_s I_s$ of the scanner coils are suitably selected, the direction of the scanning magnetic field $H_s$ is in the x-axis direction only in the case of the illustrated arrangement, and there will be no significant magnetic field in the z-axis direction. Thus, the scanning magnetic field $H_s$ can be given by the following equation.

$$H_s = h_x N_s I_s \tag{5}$$

Here, $h_x$ is a constant depending on the dimensions of x-direction scanner coil. Accordingly, when the scanning magnetic field $H_s$ is superposed in the x-axis direction, the zero magnetic field intensity point is moved along the x-axis to a position $x_s$ given by the following equation.

$$x_s = h_x/g \, N_s I_s \tag{6}$$

Accordingly, the line-shaped specifying magnetic field after the superposition of the scanning field becomes as follows.

$$\Delta H_s \simeq H_o[1 + g^2/2H_o^2\{(x-x_s)^2 + Y^2\}] \tag{7}$$

The equation (7) clearly shows that the center of the line-shaped specifying magnetic field $\Delta H_s$ is shifted to the position $x_s$. Besides, it is shown that the magnitude of the shift or scanning can be controlled by modifying the current $I_s$ in the scanner coils as can be seen from the equation (6), which indicates the proportionality between the shift $x_s$ and the current $I_s$.

Similarly, the scanning in the y-axis direction can be effected by superposing a y-axis homogeneous scanning magnetic field by a y-axis scanner coil means in a very simple and easy manner, as in the case of the above-mentioned x-axis scanning. If it is desired to scan along an oblique line on the x-y plane between the x-axis and the y-axis, such oblique scanning can be easily effected simply by applying the scanning electric currents to both of the x-axis and the y-axis scanner coil. Although a group of differential parallel wires are referred to as a line-shaped specifying magnetic field generator, the present invention is not restricted to such example, and other means for generating the line-shaped magnetic field can be used. For instance, a group of the differential coils or a group of differential magnets can be used for producing the line-shaped specifying magnetic field to be scanned by the method of the present invention.

A second embodiment will be described now. In this embodiment, the direction of the line-shaped specifying magnetic field is not fixed to but inclined by a desired angle relative to the direction of the homogeneous static magnetic field to which the specifying field is to be superposed. In this embodiment also, the line-shaped specifying magnetic field generated by the parallel four wires will be referred to for simplicity.

It is noted that the operating principles of the scanning of the line-shaped specifying magnetic field of the first embodiment is in that, when a scanning homogeneous magnetic field oriented in the scanning direction is superposed, the zero magnetic field intensity point is shifted to a point where the magnetic field generated by the parallel wires and the scanning magnetic field are of the same magnitude but in opposite direction, and the line-shaped specifying magnetic field is shifted in parallel in response to the shift of the zero magnetic field intensity point. Accordingly, the operating principles of the first embodiment are further extended by using a scanning magnetic field $g_z \cdot z$ as shown in FIG. 5, in which scanning magnetic field the magnetic field vectors in the x-axis direction are parallel and further the magnitude thereof varies linearly in the z-axis direction. When such scanning magnetic field $g_z \cdot z$ is superposed onto the line-shaped specifying magnetic field, the central position of the line-shaped specifying magnetic field, which position is the point where the x-axis component of the magnetic field produced by the parallel wires 35, 36 is cancelled by the x-axis component of the scanning magnetic field $g_z \cdot z$, can be shifted linearly in the z-axis direction, and also the direction of the line-shaped specifying magnetic field can be inclined by a desired angle relative to the direction of the z-axis. The scanning magnetic field $H_s$ having a gradient in the z-axis direction can be expressed by the following equation.

$$H_s = g_z z \tag{8}$$

When the scanning magnetic field of the equation (8) is superposed onto the line-shaped specifying magnetic field produced by the parallel wires 35, 36, the resultant synthesized specifying magnetic field can be expressed by the following equation.

$$\Delta H_s \simeq H_o[1 + g^2/2H_o^2\{(x + g_z/g \cdot z)^2 + Y^2\}] \tag{9}$$

As can be seen from the equation (9), the position of the center of the synthesized specifying magnetic field is on the line in the z-x plane as represented by the following equation $$x = -g_z/g \cdot z \tag{10}$$

and the direction of the line-shaped specifying magnetic field is also inclined to this line. Accordingly, the inclination $\phi$ of the line-shaped specifying magnetic field relative to the z-axis, i.e., relative to the homogeneous static magnetic field $H_o$, is given by the following equation.

$$\tan \phi = -(g_z/g) \tag{11}$$

In the equation (11), the value of the quantity $g_z$ can be varied by modifying the ampere-turns of the scanner coils, so that the inclination or the direction of the line-shaped specifying magnetic field can be set at a desired angle. In this case, the magnetic field intensity contours on the x-y plane at a z-axis coordinate z are circular, as can be seen from the equation (9), while in the case of seeing from the direction of the synthesized line-shaped specifying magnetic field, as the inclination $\phi$ increases, the magnetic field intensity contours become elliptic with an increasing major axis on the y-axis direction. However, such deformation of the shape of the magnetic field intensity contour can be properly compensated, for instance, by providing a group of parallel compensating wires so as to slightly weaken only the x-axis component of the magnetic field. Further, it is apparent to those skilled in that art that the direction of the line-shaped specifying magnetic field can be inclined in the direction of the y-axis direction or further in any desired direction by a desired angle, by using the similar process as described above.

A third embodiment will be described now. If the first embodiment which shifts the line-shaped specifying magnetic field in parallel and the second embodiment which inclines the line-shaped specifying magnetic field by a desired angle are combined in a suitable manner, it will become possible to scan the line-shaped specifying magnetic field along a line with an inclination $\phi$ on the z-x plane. Referring to FIG. 6, a line-shaped specifying magnetic field 38 which is sufficiently long as compared with the magnitude of a specimen 37 is applied to the specimen 37 with an inclination $\phi$ relative to the z-axis. If the line-shaped specifying magnetic field 38 is scanned in the direction of the x-axis in the manner described above, the virtual scanning direction intersects with the specimen 37 by an inclining angle $\phi$. During this scanning, the magnetic field intensity in the inside of the line-shaped specifying magnetic field is substantially uniform without any change throughout the full length thereof, so that the Larmor frequency is kept constant at any point along the length thereof. Accordingly, the above-mentioned scanning of the specifying magnetic field becomes equivalent to a scanning with a virtual inclination $\phi$. In the above-mentioned scanning of the specifying magnetic field, the scanning distance $l_\phi$ in the direction of the inclination $\phi$ is given in terms of the scanning distance $x_s$ in the x-axis direction by the following equation.

$$l_\phi = x_s \cdot \cos \phi \tag{12}$$

Accordingly, it is possible to effect scanning of a certain width in any desired direction by setting a scanning distance $x_s$ in the direction of the x-axis so as to facilitate the shifting distance $l_\phi$ in the direction of the inclination $\phi$ as determined by the equation (12), and an image of the projection of spin density distribution of the specimen in the longitudinal direction of the line-shaped specifying magnetic field or in a direction perpendicular to the inclination $\phi$ by exclusively extracting the Larmor frequency component at the center of the line-shaped specifying magnetic field. More particularly, a computed tomographic image of spin density distribution can be obtained by preparing images of the above-mentioned projections while gradually changing the inclination $\phi$ little by little in a range of 0 to $2\pi$ and carrying out computations similar to those of the so-called computed x-ray tomography (CT) of the prior art. It is noted that although, according to the equation (12), scanning is hardly possible in substance when the inclination $\phi = 90°$ or $\phi = 270°$, the above-mentioned computed tomographic image can be prepared over the entire area of the specimen without difficulty in practice, by extruding such inclinations from the projecting directions for imaging or by mechanically rotating the specimen only in the proximity of such inclinations so as to prepare the image from different projections. Thus, a tomographic image of spin density distribution of a specimen can be obtained substantially without any mechanical manipulations.

As to the method of producing a tomographic image of spin density distribution by similar computational processing of NMR signals as mentioned above, the so-called zeugmatography is known, in which a tomographic image is made by using a linear magnetic field gradient. This method of producing a tomographic image of spin density distribution of the prior art has shortcomings in that a very high linearity is required in the linear magnetic gradient to be used, that a detector with a sufficient band width characteristics is necessary to cover the entire span of the Larmor frequency distribution at various parts of the specimen, and that accumulation of the results of several times of computational processing is necessary to produce a high quality tomographic image with a high signal-to-noise (S/N) ratio. On the contrary, in the above-mentioned method of producing a tomographic image of spin density distribution by using the scanning method of the present invention, the detection of Larmor frequency of single frequency component is sufficient, so that measures to stop noises from the outside and the like can be very simple and easy to make, and furthermore, a tomographic image with an excellent S/N ratio can be regarded as easily produced by using an amplifier with a narrow band characteristics. Of course, when an amplifier with a narrow band characteristics is used, the slow response speed of such amplifier inevitably necessitates a low-speed scanning of the specifying magnetic field. However, the method according to the present invention eliminates the need of repetition of the complicated computational processings over a wide frequency range as required in the prior art for reproducing the entire Larmor frequency spectrum with a high fidelity. Thus, if the overall time necessary for producing one tomographic image is considered, the method of the present invention has a good possibility of producing it in a considerably shorter period of time than that of the prior art. Besides, the above-mentioned conventional method is required to use a separate means for determining the position for slicing the specimen for producing the tomographic image, while the method of the present invention has an advantage in that the slicing position selected by the scanning of the specimen can be automatically determined as a result of the selection of the diameter of the line-shaped specifying magnetic field.

A fourth embodiment of the invention will be described now. In this embodiment, two orthogonal sets of differential coil pairs are used, and for simplicity, it is assumed that the first differential coil pair is symmetrical with respect to the origin of the x-axis, that the planes of the coils thereof are perpendicular to the x-axis, that each of the differential coils is circular, and that the radii and the numbers of turns of the individual differential coils are the same with each other.

The magnetic field produced by the first differential coil pair disposed on the x-axis has the following components in the three axes of the orthogonal coordinate system.

$$H_x = C_{1x}\left(\frac{x}{\rho_1}\right) - \frac{3}{2} C_{3x} \frac{y^2+z^2}{\rho_1^2}\left(\frac{x}{\rho_1}\right) + C_{3x}\left(\frac{x}{\rho_1}\right)^3 + \tag{13}$$

$$H_y = -\frac{C_{1x}}{2}\left(\frac{y}{\rho_1}\right) + \frac{3}{8} C_{3x} \frac{y^2+z^2}{\rho_1^2}\left(\frac{x}{\rho_1}\right) + \tag{14}$$

$$H_z = -\frac{C_{1x}}{2}\left(\frac{z}{\rho_1}\right) + \frac{3}{8} C_{3x} \frac{y^2+z^2}{\rho_1^2}\left(\frac{z}{\rho_1}\right) + \tag{15}$$

Here, $$C_{1x} = \frac{3a_x^2 b_x}{\rho_1^4} N_x I_x \tag{16}$$

$$C_{3x} = \frac{5a_x^2 b_x(4b_x^2 - 3a_x^2)}{2\rho_1^6} N_x I_x \tag{17}$$

$$\rho_1 = \sqrt{a_x^2 + b_x^2} \tag{18}$$

In this connection, $a_x$ is the radius of the coil, $b_x$ is the distance from the origin to the coil plane, $N_x$ is the number of turns of the coil, and $I_x$ is the current in the coil which current has the same magnitude in each coil, and the direction of the current in each coil is such that the magnetic fields formed by the individual coils of the first differential coil pair are cancelled by each other.

The magnetic field produced by the first differential coil pair alone has components in all directions as can be seen from the equations (13) to (15), so that the line-shaped focusing magnetic field cannot be produced by superposition of the static magnetic field $H_o$ in whatever direction. On the other hand, the present invention positively cancel the magnetic fields in a certain direction, and the static magnetic field is superposed in that direction, so as to produce the line-shaped focusing magnetic field.

More particularly, a second differential coil pair is disposed on the y-axis while keeping the first differential coil pair on the x-axis. The magnetic fields of the second differential coil pair on the y-axis alone can be given as follows for the different axial directions in the similar manner to the first differential coil pair.

$$H_x = -C_{1y}/2(x/\rho_2) + 3/8 C_{3y} x^2 + z^2/\rho_2^2 (x/\rho_2) + \ldots \tag{19}$$

$$H_y = C_{1y}(y/\rho_2) - 3/2 C_{3y} x^2 + z^2/\rho_2^2 (y/\rho_2) + \ldots \tag{20}$$

$$H_z = -C_{1y}/2(z/\rho_2) + 3/8 C_{3y} x^2 + z^2/\rho_2^2 (z/\rho_2) + \ldots \tag{21}$$

Here, $$C_{1y} = \frac{3 a_y^2 b_y}{\rho_2^4} N_y I_y \tag{22}$$

$$C_{3y} = \frac{5 a_y^2 b_y (4 b_y^2 - 3 a_y^2)}{2 \rho_2^6} N_y I_y \tag{23}$$

$$\rho_2 = \sqrt{a_y^2 + b_y^2} \tag{24}$$

The nomenclatures in the equations for the second differential coil pair are similar to those for the first differential coil pair.

In determining the synthesized magnetic field of the above-mentioned two sets of orthogonal differential coil pairs, the following relations are assumed for simplicity.

$$a_x = a_y = a, \quad b_x = b_y = b, \quad \rho_1 = \rho_2 = \rho$$

The following equations for expressing the above synthesized magnetic field can be derived by combining the equations (13) to (15) with the equations (19) to (21).

$$H_x = \left( C_{1x} - \frac{C_{1y}}{2} \right) \left( \frac{x}{\rho} \right) + \tag{25}$$

$$\left\{ \frac{3}{8} C_{3y} \frac{x^2 + y^2}{\rho^2} - \frac{3}{8} C_{3x} \frac{y^2 + z^2}{\rho^2} \right\} + \frac{x}{\rho} + C_{3x} \left( \frac{x}{\rho} \right)^3$$

$$H_y = \left( C_{1y} - \frac{C_{1x}}{2} \right) \left( \frac{x}{\rho} \right) + \tag{26}$$

$$\left\{ \frac{3}{8} C_{3x} \frac{y^2 + z^2}{\rho^2} - \frac{3}{8} C_{3y} \frac{x^2 + z^2}{\rho^2} \right\} + \frac{y}{\rho} + C_{3y} \left( \frac{y}{\rho} \right)^3$$

$$H_z = -\frac{1}{2}(C_{1x} + C_{1y}) \left( \frac{z}{\rho} \right) + \tag{27}$$

$$\frac{3}{8} \left\{ C_{3x} \frac{y^2 + z^2}{\rho^2} + C_{3y} \frac{x^2 + y^2}{\rho^2} \right\} \left( \frac{z}{\rho} \right)^3$$

Accordingly, it is possible to form the line-shaped focusing magnetic field by selecting such $C_{1x}$ and $C_{1y}$ which nullify the 1st power term in any of the magnetic field equations for $H_x$, $H_y$, and $H_z$, and superposing the static magnetic field $H_o$ in that direction where the 1st power term is thus nullified (or the zero component direction), so as to form the line-shaped magnetic field in said direction.

There are three different approaches for the superposition of the static magnetic field in the zero component direction.

(i) Using $H_x \cong 0$, for superposing the static magnetic field $H_o$ in the x-axis direction. Thus, $C_{1y} = 2 C_{1x}$.

(ii) Using $H_y \cong 0$, for superposing the static magnetic field $H_o$ in the y-axis direction. Thus, $C_{1x} = 2 C_{1y}$.

(iii) Using $Z_z \cong 0$, for superposing the static magnetic field $H_o$ in the z-axis direction. Thus, $C_{1y} = -C_{1y}$.

Figure 7A:
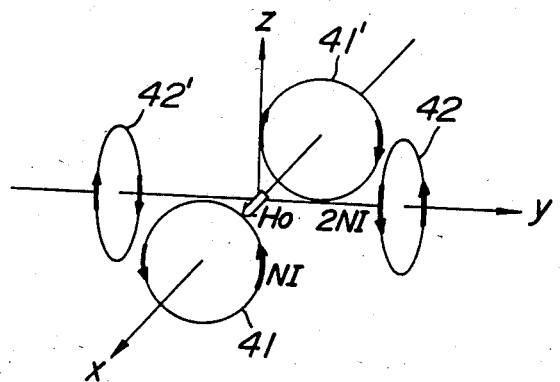
FIG. 7A and FIG. 7B are schematic perspective views showing the formation and arrangement or current-carrying coils for producing a specifying magnetic field to be used in the method according to the present invention.

Of these three approaches for the superposition of the static magnetic field, FIG. 7A schematically shows the disposition of the coils and the directions of electric currents in the coils in the case of the approach (i) for superposing the static magnetic field in the x-axis direction. In this drawing, if it is assumed that the coil radii and the coil spacings are the same between the x-axis differential coil pair 41, 41' and the y-axis differential coil pair 42, 42', and if the the ampere-turns (or number of turns alone or current alone) of the y-axis differetial coils 42, 42' are selected to be twice those of the x-axis differential coil pair 41, 41', the condition of $H_x \cong 0$ can be achieved in a certain area of the x-axis and the line-shaped specifying magnetic field in the x-axis direction can be achieved by superposing the static magnetic field $H_o$ in the x-axis direction. As to the influence of the high power terms in the equations (25) to (27), the configuration of the specifying magnetic field is likely to be deformed and distorted by the presence of the high power terms, so that the high power terms should preferably be minimized. Of the high power terms, those higher than the 5th power have very small absolute values, so that only the 3rd power terms must be carefully treated. The coefficients $C_{3x}$ and $C_{3y}$ of the 3rd power terms in the equations (25) through (27) can be made zero by suitably choosing $a_x$, $b_x$, $a_y$, and $b_y$, so that in design stage the coil radius and the coil spacing should preferably be selected in the proximity of those theoretical values which nullify the 3rd power terms. Incidentally, the 3rd power terms in the equations (25) through (27) and the 1st power term in the x-axis direction in the $H_x$ equation (25) need not be exactly zero, but it is sufficient that they are small enough for eliminating adverse effects thereof. Although the coil radii and the coil spacings are assumed to be the same between the x-axis differential coil pair and the y-axis differential coil pair for simplicity of the description, such coil radii and such coil spacings can be different between the x-axis and the y-axis and the shape of such coils can be other than circular, e.g., elliptic, provided that such coil pairs are disposed and related to each other in a differential fashion and that the two differential coil pairs are so arranged that the magnetic fields of the two differential coil pairs cancel each other in the x-axis direction.

In the approach (i) for superposition of the static magnetic field in the x-axis direction, the first power term coefficient $C_{1y}$ of the y-axis differential coil pair and the first power term coefficient $C_{1x}$ of the x-axis differential coil pair should satisfy the following relationship.

$$C_{1y} = 2C_{1x} \tag{28}$$

Thus, if the y-axis differential coil pair and the x-axis differential coil pair have the same coil radii and coil spacings, the ampere-turns of the y-axis should be twice that of the x-axis. Under such conditions, if $$C_{1x} = C_1 \tag{29}$$

is assumed, then the variation of the intensity of the line-shaped specifying magnetic field becomes as follows.

$$\Delta H(y,z) = 9C_1^2/8H_0\rho^2 \, (y^2+z^2) \tag{30}$$

In this connection, the direction of superposition of the homogeneous static magnetic field $H_o$ from the outside of the differential coils is that of the x-axis. In the above description, it is implicitly assumed that the zero magnetic field intensity point of the x-axis differential coil pair and the zero magnetic field intensity point of the y-axis differential coil pair are arranged to coincide with each other. However, it is also allowed that the two zero magnetic field intensity points do not coincide with each other or the axes of symmetry of the two differential coil pairs do not intersect each other, because although the failure of such coincidence causes a small deviation of the center of the line-shaped specifying magnetic field produced thereby, and hence it does not cause any serious difficulty in the production of the line-shaped specifying magnetic field. In fact, the tolerance which allows the non-coincidence of the zero magnetic field intensity points can be advantageously used in the scanning of the specifying magnetic field.

Of the above-mentioned three approaches for the superposition of the static magnetic field, the approach (ii) for the superposition in the y-axis direction is nothing but the interchange of the operative functions of the x-axis differential coil pair with those of the y-axis differential coil pair in the approach (i) for the superposition in the x-axis direction. Accordingly, the detailed description of the approach (ii) will not be made here.

Figure 7B:
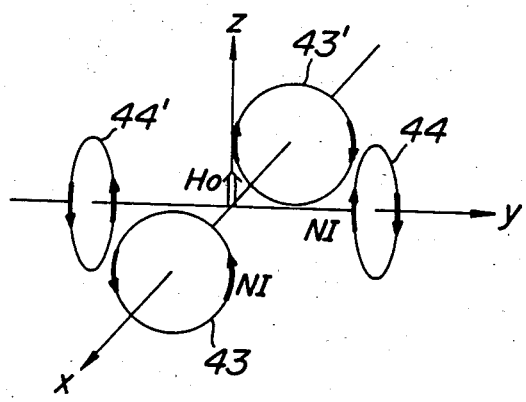

However, the approach (iii) for the superposition in the z-axis direction is greatly different from both the approach (i) and the approach (ii). More particularly, as an example of the approach (iii), FIG. 7B schematically illustrates the manner, such as the directions of currents, in which the magnetic field components of the first and the second differential coil pair cancel each other in the z-axis direction perpendicular to the axes of both of those coil pairs and the static magnetic field is superposed in this z-axis direction. In the approach of FIG. 7B, if the condition of $$C_{1x} = -C_{1y} = C_1 \tag{31}$$

is assumed, then the variation of the intensity of the line-shaped specifying magnetic field produced by superposing the homogeneous static magnetic field $H_o$ in the z-axis direction becomes as follows.

$$\Delta H(x,y) = 9C_1^2/8H_0\rho^2 \, (x^2+y^2) \tag{32}$$

Thus, the variation of the magnetic field intensity in this case can be expressed in the same form as that of the equation (30) of the above-mentioned approach (i).

It is assumed that the coil radii and the coil spacings are selected such that the coefficients of the 3rd power terms in the equations for each differential coil pair is sufficiently small as compared with the coefficients for the 1st power terms.

In the approach (iii) for the superposition in the z-axis direction, if the coil radii and the coil spacings in the x-axis differential coil pair 43, 43' are the same as those of the y-axis differential coil pair 44, 44', the ampere-turns can be the same in both of the differential coil pairs, and such relationship is very convenient from the standpoint of manufacture. As to the matters concerning the configurations, arrangements, and other design conditions of the coils, what have been described by referring to the approach (i) for the superposition in the x-axis direction are also applicable to the approach (iii) for the superposition in the z-axis direction.

In the fourth embodiment as described in detail in the foregoing, the coil radii and the coil spacings of each differential coil pair are selected so as to make the 3rd power terms zero in the equations of the magnetic field intensity variation. More particularly, when the shape of each coil in the differential coil pairs is circular, the equation (17) represents the conditions for making the 3rd power terms zero, and the relationship between the coil radius a and the coil spacing b for satisfying the conditions of the above-mentioned equation becomes as follows.

$$b = \sqrt{3/2}\, a \tag{33}$$

Thus, under the optimal conditions of the equation (33), the coil spacing is larger than the coil diameter in each differential coil pair, and if the two sets of the differential coil pairs to be combined have the coils of the same diameter, the coils of the two coil pairs may contact with each other. In this case, suitable measures should be taken so as to prevent the coils of the differential coil pairs from coming into contact with each other, for instance by increasing the coil radius a and the coil spacing b in one of the two sets of the differential coil pairs while keeping the conditions of the equation (33). In general, however, the coil arrangement for nullifying the 3rd power terms in the equations of the magnetic field variation is not necessarily practicable in terms of physical layout. When non-circular coils, such as square or rectangular coils, are used, the optical conditions for nullifying the 3rd power terms may become different from those of the equation (33) and the condition for selecting the coil radii and coil spacings will become different accordingly.

A fifth embodiment of the invention will be described now. In this embodiment, an arrangement of magnetic field generator coils for producing the line-shaped specifying magnetic field is disclosed for the case in which the optimal conditions for nullifying the 3rd power terms in the equations of the magnetic field intensity variation cannot be fulfilled in the above-mentioned manner. For simplicity, the shape of the coils is assumed to be circular in this embodiment, too.

In general, the variation of the intensity of the specifying magnetic field produced by any one of the above-mentioned approaches (i) through (iii) of the fourth embodiment can be expressed as follows:

$$\Delta H = 9C_1^2/8H_o\rho^2 \, r^2 + C_3/H_o f(x^2, y^2, z^2)(x/\rho) \qquad (34)$$

Here, r represents the distance from the origin on a plane perpendicular to the static magnetic field $H_o$, and X is a variable on a coordinate in the direction of the static magnetic field $H_o$. In the approach (i) of the fourth embodiment, $X \equiv x$, in the approach (ii) thereof, $X \equiv y$, and in the approach (iii) thereof, $X \equiv z$. The function $f(x^2, y^2, z^2)$ represents a linear combination of the variables $x^2$, $y^2$, and $z^2$, and the form of the linear combination depends on the conditions of the above-mentioned approaches (i) through (iii).

The second term in the equation (34) represents the 3rd power distortion or error depending on the third term in the equation of the intensity variation of the magnetic field produced by the differential coil pairs, and in order to make the line-shaped specifying magnetic field as shown by the equation (34) suitable for the specifying magnetic field, the value of the second term must be sufficiently small as compared with that of the first term over a certain range of the variable X. Since the coefficients $C_1$ and $C_3$ are proportional to the ample-turns of the differential coil pairs as can be seen from the equations (16), (17) or (22), (23), the coefficient of the first term of the equation (34) is proportional to the square of the ampere-turns of said coil pairs, and the coefficient of the second term thereof is straightly proportional to such ampere-turns. Accordingly, when the differential coil pairs have a certain coil spacing between the paired coils thereof, if a sufficiently large ampere-turns are assigned to the differential coil pairs by design, a line-shaped specifying magnetic field can be obtained over a desired area. Whereby, restrictions on the coil spacing of the differential coil pairs can be greatly relieved. Although circular coils of the differential coil pairs are assumed in the foregoing explanation for simplicity, the method of the present invention is not restricted to the circular coils and differential coil pairs with coils of other shapes can be also used in the method of the invention.

The specifying magnetic field generating method to be used for the present invention will be compared with the conventional specifying magnetic field generating method. The group of parallel wires for generating the line-shaped specifying magnetic field in the prior art has not magnetic field components in the longitudinal direction thereof to begin with, so that the electric currents to be fed to such parallel wires need not be accurately set. On the contrary, with the combination of the differential coils of the present invention, the magnetic fields of the individual differential coil pairs cancel each other so as to eliminate the magnetic field in that direction, so that the electric currents to be fed to the differential coils must be accurately set. Thus, as far as the setting of the electric currents to be fed to the coils is concerned, the method of the invention appears to be slightly more complicated. However, the group of parallel wires of the prior art must have a sufficient length as compared with the width thereof, so that the apparatus of the prior art has been big. On the contrary, the width and the depth of the line-shaped specifying magnetic field generator means of the present invention can be of the order of the coil diameter. Accordingly, the present invention has an outstanding advantage in that the size of the specifying magnetic field generator means can be made very small as compared with that of the group of parallel wires of the prior art. Further, for a given number of wires or winding turns, the specifying magnetic field generator of the present invention uses much less length of the conductive wires such as copper wires, so that electric power for driving the coils can be considerably reduced by the method of the invention, in addition to the apparent possibility of reducing the overall size and the weight of the apparatus. Thus, the method of the present invention has a number of important advantages from the practical viewpoints.

A sixth embodiment of the invention will be described now. In this embodiment, the current-carrying coils for producing the differential magnetic field in the preceding embodiments are replaced by permanent magnets. In general, a closed loop current can be replaced with a disk magnet having a shape which is similar to the periphery of the current-carrying coil. Accordingly, even if some or all of the two sets of the differential coil pairs are replaced with disk magnets, a line-shaped specifying magnetic field similar to that of the fourth embodiment can be obtained. FIG. 8 schematically shows an example of the practical formation of such specifying magnetic field generator using permanent magnets. In the illustrated embodiment, the differential coil pairs 43, 43' and 44, 44' of FIG. 7B are all replaced by disk magnets 45, 45' and 46, 46' respectively. If the two disk magnets 45, 45' disposed on the x-axis have the S poles thereof facing toward each other, and if the two disk magnets 46, 46' disposed on the y-axis have the N poles thereof facing toward each other, the configuraiton of the magnetic lines of force of the synthesized magnetic field of these two pairs of disk magnets becomes similar to that of the FIG. 7B, so that the z-axis components of the magnetic fields of the disk magnet pairs on the x-axis and y-axis cancel each other and the z-axis component of the synthesized magnetic field becomes substantially zero. Hence, a line-shaped specifying magnetic field can be obtained by superposing the homogeneous static magnetic field $H_o$ in the direction of the z-axis, as in the case of the preceding embodiment.

Merits of using the permanent magnets will be examined now. For simmplicity, if the condition of $\rho \cong a \cong b$ is assumed, one can derive the relationship of $C_1 \cong (3/\rho)NI$ from the equation (16) or (22). Accordingly, if $(z^2+z^2)$ or $(x^2+y^2)$ is replaced with $r^2$ in the equation (30) or (32) and the above-mentioned value $C_1$ is substituted, the following relationship is obtained.

$$\Delta H/r^2 = 9C_1^2/8H_o\rho^2 \cong 81(NI)^2/8H_o\rho^4 \qquad (35)$$

Based on the equation (35), when a certain magnetic field intensity variation profile ($\Delta H/r^2$) is provided, the ampere-turns of the differential coil pairs of the fourth embodiment must meet the following conditions so as to produce a line-shaped specifying magnetic field with the same variation of the intensity of the magnetic field.

$$NI \alpha \sqrt{H_o\rho^2} \qquad (36)$$

Accordingly, in the case of a specifying magnetic field generator system having coils of big size or a specifying magnetic field generator system with a strong static magnetic field $H_o$, the ampere-turns required for the differential coil pairs tends to increase rapidly so as to cause a practical difficulty in the winding and the power source for excitation of the differential coils. However, if strong permanent magnets with good characteristics are used in lieu of such hardly practicable current-carrying coils, such permanent magnets can be procured comparatively easily. Thus, as an outstanding feature of the present invention, a very compact apparatus based on the sixth embodiment using a combination of permanent magnet pairs can be provided for generating the line-shaped specifying magnetic field.

A seventh embodiment of the invention will be described lastly. In this embodiment, the static magnetic field $H_o$ to be superposed for producing a line-shaped magnetic field is not homogeneous as in the case of the preceding embodiments, but the intensity of the static magnetic field of the seventh embodiment increases with the distance in the axial direction of the line-shaped magnetic field from the center thereof in either direction, whereby a specifying magnetic field with completely closed equipotential surfaces of the magnetic field intensity, such as spherical or ellipsoidal equipotential surfaces, is produced. In FIG. 9 schematically showing an arrangement of coils in the seventh embodiment, two sets of differential coils 47, 47' and 48, 48' are disposed in a manner similar to that as shown in FIG. 7B, and an additive coil pair 49, 49' are disposed on the z-axis. In the additive coil pair 49, 49', the two coils are disposed face to face with a coil spacing b which is wider than the Helmoltz condition of $2b=a$, a being the coil radius, i.e., $2b>a$, and electric currents of the same direction are applied to the two coils. In the magnetic field of the additive coil pair 49, 49' on the z-axis, the direction of the magnetic field is substantially in line with the z-axis, and the intensity of the magnetic field along the axial direction increases as the distance from the coils decreases, while the magnetic field intensity decreases as the radial distance from the coils decreases. On the other hand, if suitable ampere-turns are provided in the differential coil pairs 47, 47' in the x-axis and 48, 48' in the y-axis, the synthesized magnetic field produced by those two sets of differential coils has no z-axis component of the magnetic field, and the synthesized magnetic field on a plane perpendicular to the z-axis has a zero point on the z-axis and the intensity of the magnetic field increases with the radial distance from the z-axis, as described hereinbefore by referring to the fourth embodiment. Thus, in a suitable range of ampere-turns of the additive coils on the z-axis, the overall synthesized magnetic field produced by the two sets of differential coil pairs and the one additive coil pair becomes as follows: namely, the radially decreasing tendency of the magnetic field produced by the additive coil pair on the z-axis is compensated for by the radially (about the z-axis) increasing tendency of the magnetic field produced by the two sets of the differential coil pairs on x-axis and y-axis, so that in the overall synthesized magnetic field under the arrangement of FIG. 9, the intensity of the magnetic field tends to increase with the distance from the origin in a three-dimensional fashion. In the magnetic field with such tendency of the intensity of magnetic field, it is easily understood that the equipotential surfaces become closed surfaces about the origin, such as spherical or ellipsoidal equipotential surfaces.

In the above-mentioned generation of the specifying magnetic field, even if a homogeneous static magnetic field is superposed in the direction of constant (0th power) term in the equation of the magnetic field intensity variation of the magnetic field produced by the additive coil pair on the z-axis, such superposition will not cause any substantial change in the topological properties of the overall synthesized magnetic field, so that such homogeneous static magnetic field can be superposed arbitrarily. The ampere-turns required for the individual current-carrying coils under such conditions will be affected by the superposition of the homogeneous static magnetic field, so that this point should be reviewed when the superposition of the homogeneous static magnetic field is considered under such conditions.

In the preceding description, it is assumed that the coil spacing in the additive coil pair on the z-axis is wider than that of the Helmholtz condition. If the above-mentioned coil spacing is narrower than that of the Helmholtz condition, the tendencies of the changes of the magnetic field intensity in the z-axis direction and the radial direction become completely opposite to the tendencies in the case of the coil spacing wider than that of the Helmholtz condition. Accordingly, even if the additive coil pair with such tendency of the magnetic field intensity variation is combined with the differential coil pairs, the axially decreasing tendency in the z-axis direction and the radially increasing tendency are not varied in the overall synthesized magnetic field, so that the above-mentioned closed three-dimensional equipotential surfaces of the magnetic field intensity cannot be obtained. However, even in this case, if the homogeneous static magnetic field $H_o$ is superposed in the direction opposite to the constant (0th power) term in the equation of the magnetic field intensity variation of the magnetic field of the additive coil pair on the z-axis, in the synthesized magnetic field of the thus superposed homogeneous static magnetic field $H_o$ and the magnetic field of the additive coil pair on the z-axis, the magnetic field intensity is minimized at the origin on the z-axis and increases with the distance therefrom along the z-axis, while the magnetic field intensity tends to decrease in the radial direction. Accordingly, even when the coil spacing in the additive coil pair on the z-axis is made narrower than that of the Helmholtz condition, it is possible to produce a specifying magnetic field having closed equipotential surfaces of magnetic field intensity such as spherical or ellipsoidal equipotential surfaces.

As is apparent from the foregoing detailed description, according to the method of the present invention, a line-shaped specifying magnetic field necessary for the NMR imaging can be produced in a desired direction by applying compensation of magnetic field intensity in the desired direction by superposing a homogeneous static magnetic field to either two orthogonal sets of differential coil or magnet pairs or a combination of said two sets and one additive coil pair perpendicular to the differential pairs. More particularly, the specifying magnetic field necessary for the NMR imaging can be produced by a very small magnetic field generator of light weight, so as to obtain a special effect such as easy and dependable extraction of excellent internal information of a target is ensured.

Furthermore, according to the method of the invention, the spin density distribution of a nuclear magnetic substance carrying the internal information of the target can be easily detected by using the NMR phenomenon, and such detection can be effected by an apparatus of simple construction which scans the line-shaped specifying magnetic field. As a result, tomographic images of the NMR signals similar to conventional x-ray tomograms can be obtained by simple computational treatment of the detected spin density distribution.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method of scanning a specifying magnetic field for nuclear magnetic resonance (NMR) imaging of internal information associated with a target placed in a homogeneous static magnetic field $H_o$ by detecting NMR signals generated in said target in response to application of a high-frequency magnetic field thereto which has a Larmor frequency corresponding to an intensity of said static magnetic field, said method comprising the steps of:

generating a specifying magnetic field $\Delta H_s$ by synthesizing said static magnetic field $H_o$ with a magnetic field produced by a group of magnetomotive generating means; and moving spatially a center of said specifying magnetic field $\Delta H_s$ by superposing a scanning magnetic field produced by a scanner coil onto a specific direction component of said magnetic field produced by said group of magnetomotive generating means, said specific direction component dominating an intensity variation of said specifying magnetic field $\Delta H_s$.

2. A method as set forth in claim 1, wherein said group of magnetomotive generating means are formed of coils.

3. A method as set forth in claim 1, wherein said group of magnetomotive generating means are formed of permanent magnets.

4. A method as set forth in claim 1, wherein said magnetic field produced by said group of magnetomotive generating means has magnetic field components only in directions parallel to a specific plane perpendicular to said static magnetic field $H_o$, an intensity of said magnetic field components being zero at a certain point on said specific plane and increasing with distance from said certain point with zero intensity, whereby said specifying magnetic field $\Delta H_s$ is made into a line-shaped magnetic field having closed magnetic field intensity contours around a normal to said specific plane at said certain point with zero intensity.

5. A method as set forth in claim 4, wherein said group of magnetomotive generating means formed of a group of parallel wires.

6. A method as set forth in claim 4, wherein said group of magnetomotive generating means are formed of a plurality of counter-polarized combinations of coils.

7. A method as set forth in claim 4, wherein said group of magnetomotive generating means are formed of a plurality of counter-polarized combinations of permanent magnets.

8. A method as set forth in claim 4, wherein an intensity of said scanning magnetic field on said specific plane except at said certain point thereon is not equal to an intensity of said specifying magnetic field $\Delta H_s$, so that a center of said specifying magnetic field $\Delta H_s$ is moved by cancelling a portion thereof on said specific plane so as to cause said certain point with zero intensity to move on said specific plane, while a rate of movement of said certain point with zero intensity is varied by regulating ampere-turns of said scanner coil.

9. A method as set forth in claim 4, wherein a variation of the intensity of the component of said specifying magnetic field $\Delta H_s$ on said specific plane which is perpendicular to said static magnetic field $H_o$ is substantially linear, and said scanning magnetic field is a homogeneous magnetic field in a direction on said specific plane, whereby movement of said certain point with zero intensity is a linear function of an intensity of said scanning magnetic field.

10. A method as set forth in claim 4, wherein a direction of said scanning magnetic field is always in a plane perpendicular to said static magnetic field $H_o$, and an intensity of said scanning magnetic field varies linearly in a direction of said static magnetic field $H_o$, whereby a direction of said line-shaped specifying magnetic field $\Delta H_s$ is inclined from the direction of said static magnetic field $H_o$ by an arbitrary angle.

11. A method as set forth in claim 1, wherein said group of magnetomotive generating means are formed of a first coil group and a second coil group, each of said coil groups having a plurality of coils disposed such that, when electric currents of specific magnitudes and specific directions are applied thereto, constant (0th power) components of magnetic fields produced by individual coils are cancelled by each other, so as to substantially eliminate constant components in magnetic fields produced by said coil groups, said first coil group and said second coil group being combined such that certain direction components of magnetic fields produced by said two coil groups are cancelled by each other in a certain area, whereby said specifying magnetic field $\Delta H_s$ is synthesized in a line-shaped form.

12. A method as set forth in claim 11, wherein said group of magnetomotive generating means further includes a substantially homogeneous static magnetic field superposed in a direction of said certain direction components of magnetic fields produced by said two coil groups, so that magnetic field contours become substantially parallel to said certain direction components of magnetic fields produced by said two coil groups which are cancelled by each other, while said magnetic contours are closed in a plane perpendicular to the direction of said certain direction components.

13. A method as set forth in claim 12, wherein said substantially homogeneous static magnetic field is produced by a magnetic field generator means so as to have a minimum value of an axial direction component thereof at a certain position, so that a synthesized magnetic field of said substantially homogeneous static magnetic field and a magnetic field produced by said first and said second coil group has closed equal intensity surfaces of magnetic field.

14. A method as set forth in claim 13, wherein said magnetic field generator means is formed of a combination of coils.

15. A method as set forth in claim 13, wherein said magnetic field generator means is formed of a combination of permanent magnets.

16. A method as set forth in claim 13, wherein said closed equal intensity surfaces are spherical surfaces.

17. A method as set forth in claim 13, wherein said closed equal intensity surfaces are ellipsoidal surfaces.

18. A method as set forth in claim 11, wherein said first coil group and said second coil group are a first differential coil pair and a second differential coil pair respectively, each of said differential coil pairs has two coils disposed on a common axis so as to cause cancellation of magnetic fields produced thereby, a distance between said two coils in each differential coil pair being such that a cubic (3rd power) term component of magnetic field intensity variation is minimized and a magnetic field intensity variation is substantially linear in a certain area, axes of said first and said second differential coil pair being disposed perpendicular to each other, and electric currents with such magnitude and direction are applied to said first and said second differential coil pairs so that said certain direction components of magnetic fields produced by said differential coil pairs are cancelled by each other.

19. A method as set forth in claim 18, wherein at least a part of said first and said second differential coil pairs is replaced with permanent magnets which are similar in function with loop currents in said coil pairs.

20. A method as set forth in claim 18, wherein a substantially homogeneous static magnetic field is superposed in a in wich direction a synthesized magnetic field produced by said first and said second differential coil pair has no component thereof.

21. A method as set forth in claim 20, wherein said substantially homogeneous static magnetic field is produced by a magnetic field generator means so as to have a minimum value of an axial direction component thereof at a certain position, so that a synthesized magnetic field of said substantially homogeneous static magnetic field and a magnetic field produced by said first and said second coil pair has closed equal intensity surfaces of magnetic field.

22. A method as set forth in claim 21, wherein said magnetic field generator means is formed of a combination of coils.

23. A method as set forth in claim 21, wherein said magnetic field generator means is formed of a combination of permanent magnets.

24. A method as set forth in claim 21, wherein said closed equal intensity surfaces are spherical surfaces.

25. A method as set forth in claim 21, wherein said closed equal intensity surfaces are ellipsoidal surfaces.

26. A method as set forth in claim 18, wherein ampere-turns of said first and said second differential coil pair are set such that a distance between the two coils in each coil pair can be arbitrarily set.

27. A method as set forth in claim 11, wherein at least a part of said first and said second coil group is replaced with permanent magnets which are similar in function with loop currents in said coil groups.

\* \* \* \* \*